United States Patent
Fujita et al.

(10) Patent No.: US 7,221,161 B2
(45) Date of Patent: May 22, 2007

(54) COIL ARRAYS FOR PARALLEL IMAGING IN MAGNETIC RESONANCE IMAGING

(75) Inventors: Hiroyuki Fujita, Highland Heights, OH (US); Mark Xueming Zou, Mantua, OH (US); Dan K. Spence, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/761,854

(22) Filed: Jan. 21, 2004

(65) Prior Publication Data

US 2004/0196042 A1      Oct. 7, 2004

Related U.S. Application Data

(60) Provisional application No. 60/441,518, filed on Jan. 21, 2003.

(51) Int. Cl.
*G01V 3/00*      (2006.01)
(52) U.S. Cl. ........................................ 324/318; 324/309
(58) Field of Classification Search ................ 324/318, 324/319, 309, 307, 300, 322, 320; 600/412, 600/410, 422
See application file for complete search history.

(56) References Cited

U.S. PATENT DOCUMENTS

| | | | | |
|---|---|---|---|---|
| 4,812,761 A | * | 3/1989 | Vaughan | 324/307 |
| 5,162,739 A | * | 11/1992 | Doty | 324/322 |
| 5,323,113 A | * | 6/1994 | Cory et al. | 324/318 |
| 5,389,880 A | * | 2/1995 | Mori | 324/318 |
| 5,394,087 A | * | 2/1995 | Molyneaux | 324/318 |
| 5,689,189 A | * | 11/1997 | Morich et al. | 324/318 |
| 5,929,639 A | * | 7/1999 | Doty | 324/318 |
| 6,060,882 A | * | 5/2000 | Doty | 324/318 |
| 6,377,836 B1 | * | 4/2002 | Arakawa et al. | 600/422 |
| 6,493,572 B1 | * | 12/2002 | Su et al. | 600/422 |
| 6,590,392 B2 | * | 7/2003 | Boskamp et al. | 324/318 |
| 6,930,480 B1 | * | 8/2005 | Fujita et al. | 324/318 |

\* cited by examiner

*Primary Examiner*—Brij B. Shrivastav
(74) *Attorney, Agent, or Firm*—The Small Patent Law Group LLP; Dean D. Small (57) ABSTRACT

A system and method for configuring coils in a coil array are provided. The system includes a coil arrangement for a medical imaging system. The coil arrangement includes a plurality of coil elements for a medical imaging system and a plurality of twisted portions in combination with at least one of the plurality of coil elements.

21 Claims, 5 Drawing Sheets

COIL ARRAYS FOR PARALLEL IMAGING IN MAGNETIC RESONANCE IMAGING

CROSS REFERENCE TO RELATED APPLICATIONS

This application claims priority to and the benefit of the filing date of U.S. Provisional Application No. 60/441,518, filed on Jan. 21, 2003 and which is hereby incorporated by reference in its entirety.

BACKGROUND OF THE INVENTION

This invention relates generally to magnetic resonance imaging (MRI) systems and, more particularly, to radio-frequency (RF) coils in such systems.

Magnetic Resonance Imaging (MRI) utilizes hydrogen nuclear spins of the water molecules in the human body, which are polarized by a strong, uniform, static magnetic field generated by a magnet (typically denoted as $B_0$—the main magnetic field in MRI physics). The magnetically polarized nuclear spins generate magnetic moments in the human body. The magnetic moments point or are aligned parallel to the direction of the main magnetic field $B_0$ in a steady state and produce no useful information if they are not disturbed by any excitation.

The generation of nuclear magnetic resonance (NMR) signals for MRI data acquisition is accomplished by exciting the magnetic moments with a uniform radio-frequency (RF) magnetic field (typically referred to as the $B_1$ field or the excitation field), for example, by applying a uniform RF magnetic field orthogonal to $B_0$. This RF field is centered on the Larmor frequency of protons in the $B_0$ field and causes the magnet moments to mutate their alignment away from $B_0$ by some predetermined angle. The $B_1$ field is produced in the imaging region of interest typically by an RF transmit coil that is driven by a computer-controlled RF transmitter with a RF power amplifier. During excitation, the nuclear spin system absorbs magnetic energy, and the magnetic moments precess around the direction of the main magnetic field. After excitation, the precessing magnetic moments will go through a process of free induction decay (FID), releasing their absorbed energy and returning to a steady state. During FID, NMR signals are detected by the use of a receive RF coil that is placed in the vicinity of the excited volume of a human body. The NMR signal is an induced electrical motive force (electrical voltage or current) in the receive RF coil that has been induced by the flux change over a period of time due to the relaxation of precessing magnetic moments of the human tissue. The receive RF coil can be either the transmit coil itself or an independent receive-only RF coil. The NMR signal is used for producing MR images by using additional pulsed magnetic gradient fields that are generated by gradient coils integrated inside the main magnet system. The gradient fields are used to spatially encode the signals and selectively excite a specific volume of the human body. There are usually three sets of gradient coils in a standard MRI system that generate magnetic fields in the same direction of the main magnetic field and vary linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (SNR or S/N) if it is also used for reception, mainly because of its greater distance from the signal-generating tissues being imaged. Because a high signal-to-noise ratio is the most desirable in MRI, special-purpose coils are used for reception to enhance the SNR ratio from the volume of interest.

In practice, a well-designed specialty RF coil has the following functional properties: high SNR ratio, good uniformity, high unloaded quality factor (Q) of the resonance circuit, and high ratio of the unloaded to loaded Q factors. In addition, the coil device must be mechanically designed to facilitate patient handling and comfort, and to provide a protective barrier between the patient and the RF electronics. Another way to increase the SNR is by quadrature reception. In this method, NMR signals are detected in two orthogonal directions that are in the transverse plane or perpendicular to the main magnetic field. The two signals are detected by two independent individual coils that cover the same volume of interest. With quadrature reception, the SNR can be increased, for example, by up to $\sqrt{2}$, over that of the individual linear coils.

To cover a large field-of-view, while maintaining the SNR characteristic of a small and conformal coil, linear surface coil arrays are used, for example, to image the entire human spine or to provide cervical, thoracic, lumbar (CTL) spine imaging. These linear surface coil arrays typically include an array of planar linear surface coil elements. However, these coil systems do not operate well for imaging deep tissues, such as, for example, the blood vessels in the lower abdomen, due to the sensitivity drop-off away from the coil surface.

To image the lower extremities, for example, lower human extremities, quadrature phased array coils have been utilized. One known quadrature phased array coil images the lower extremities by using two orthogonal linear coil arrays, for example, six planar loop coil elements placed in the horizontal plane and under the patient, and six planar loop coil elements placed in the vertical plane and in between the legs of the patient. Another known quadrature phased array coil images, for example, the blood vessels from the pelvis of patient and lower. This quadrature phased array coil includes two orthogonal linear coil arrays extending in the head-to-toe direction, for example, a planar array of loop coil elements positioned laterally and centrally located above a second array of butterfly coil elements. The loop coil elements, for example, are placed immediately under the patient and the butterfly coil elements are wrapped around the patient.

In MRI, gradient coils are routinely used to provide phase-encoding information to a sample to be imaged. To obtain an image, all of the data points in a so-called "k-space" (i.e., frequency space) must be collected. Some of the data points in the k-space are intentionally skipped and at the same time the intrinsic sensitivity information of the RF receive coils is used as the phase-encoding information for the skipped data points. This operation occurs simultaneously and, thus, is referred to as partially parallel imaging or partially parallel acquisition (PPA). By collecting multiple data points simultaneously, less time is required to acquire the same amount of data (e.g., image data) as compared to a conventional gradient-only phase-encoding approach. The time savings can be used to reduce total imaging time, in particular, for applications in which cardiac or respiratory motions in tissues being imaged become concerns, or to collect more data to achieve better resolution or SNR. PPA may be used to improved both temporal resolution (e.g., shorter acquisition time) and spatial resolution (e.g., collect more data points while the acquisition time remains unchanged).

Simultaneous Acquisition of Spatial Harmonics (SMASH) and Sensitivity Encoding (SENSE) are two methods of PPA. The two methods also may be combined to produce a hybrid method. SMASH utilizes parallel imaging by skipping phase encode lines that yield a decreasing field-of-view (FOV) in the phase-encoding direction and uses coils (e.g., coil arrays) together with reconstruction techniques to fill in the missing data points in the k-space. SENSE, on the other hand, utilizes a reduced FOV in the read direction, resulting in an aliased image that is then unfolded in the x-space (i.e., real space), while using the RF coil sensitivity information to obtain a true corresponding image. SENSE uses the phase and magnitude difference between signals from multiple coils to skip some of the phase encoding steps. By skipping some of the phase encoding steps, the image acquisition time is reduced, for example, by a reduction factor R, with the factor R equaling the number of independent coils/arrays. In SENSE imaging, the SNR is defined as: $SNR_{SENSE}=SNR_{FULL}/\{g\sqrt{R}\}$, where $SNR_{FULL}$ is the SNR that may be achieved when all the phase encoding steps are collected by a traditional gradient phase encoding scheme. $SNR_{SENSE}$ is optimized when the geometry factor g equals one. To obtain a "g" of one, traditional decoupling techniques such as overlapping nearest adjacent coil elements to null the mutual inductance between the coils may have to be relaxed.

The SENSE and SMASH or a hybrid approach have different RF coil design requirements than traditional coil designs. For example, in SMASH, the primary criterion for the coil array is that it is capable of generating sinusoids whose wavelengths are on the order of the FOV. Thus, the target FOV along the phase encoding direction for the array is determined in this manner. Conventional array designs can incorporate element and array dimensions that will give optimal SNR for the object of interest. Furthermore, conventional array designs may select almost any FOV so long as severe aliasing artifacts are not a concern. On the other hand, when using SMASH, the size of the array determines the approximate range of FOVs that can be used in the imaging test. This then determines the approximate element dimensions, assuming complete coverage of the FOV is desired, as in most cases.

SENSE is based upon the principle that the sensitivity of a RF receiver coil generally has a phase-encoding effect complementary to those achieved by linear field gradients. For SENSE imaging, the elements of a coil array may be smaller than for common multi-array imaging, resulting in a trade-off between basic noise and geometry factor. Further, when using SENSE, adjacent coil elements may not be overlapped for a net gain in SNR due to the improved geometry factor.

Thus, PPA design requirements are different than for traditional coil arrays based in part on the different operating characteristics. For example, SNR is intrinsically reduced when imaging time is reduced. Thus, to compensate for the SNR loss, the size of coil elements in PPA coil arrays tend to be smaller than the elements of a conventional array element.

Some known PPA coil arrays are based upon traditional RF coil design requirements using conventional coil design schemes and thus have the limitations of conventional systems (e.g., increased acquisition time). Further, some known PPA coil array designs include non-overlapping adjacent coil elements in an attempt to provide better definition in the individual phase and magnitude information associated with each RF coil used in the array, for example, to obtain information of $B_1$ of a receive coil in SENSE applications. Without overlap, a net gain in SNR may be realized when using SENSE imaging, but the coupling between coils may also increase.

Thus, these known PPA coil arrays are not optimized for parallel imaging operation and limit the design options for such arrays. Therefore, the operation and control of an associated MRI system, operating, for example, using SENSE or SMASH is limited when using these known coil arrays.

BRIEF DESCRIPTION OF THE INVENTION

In one exemplary embodiment, a coil arrangement for a medical imaging system is provided. The coil arrangement includes a plurality of coil elements for a medical imaging system and plurality of twisted portions in combination with at least one of the plurality of coil elements.

In another exemplary embodiment, a method for providing coil arrays for a medical imaging system is provided. The method includes configuring a coil array to include a plurality of twisted portions in combination with a plurality of other coil elements.

DETAILED DESCRIPTION OF THE INVENTION

Various exemplary embodiments of the present invention provide a system and method for parallel imaging, such as partial parallel imaging or partial parallel acquisition (PPA), and more particularly, coil arrangements for use in a magnetic resonance imaging (MRI) system to provide parallel imaging. For example, the various exemplary embodiments provide coil arrays optimized for operation in PPA. The coil arrays of the various embodiments provide improved volume and surface array coils that cover a large field-of-view (FOV) while providing greater SNR. The coil arrays can be used, for example, as a PPA targeted coil for imaging a large volume such as a head, abdomen, torso or heart. Further, and for example, the coil arrays provide better SNR, for example, for torso and cardiac imaging using PPA.

Figure 1:
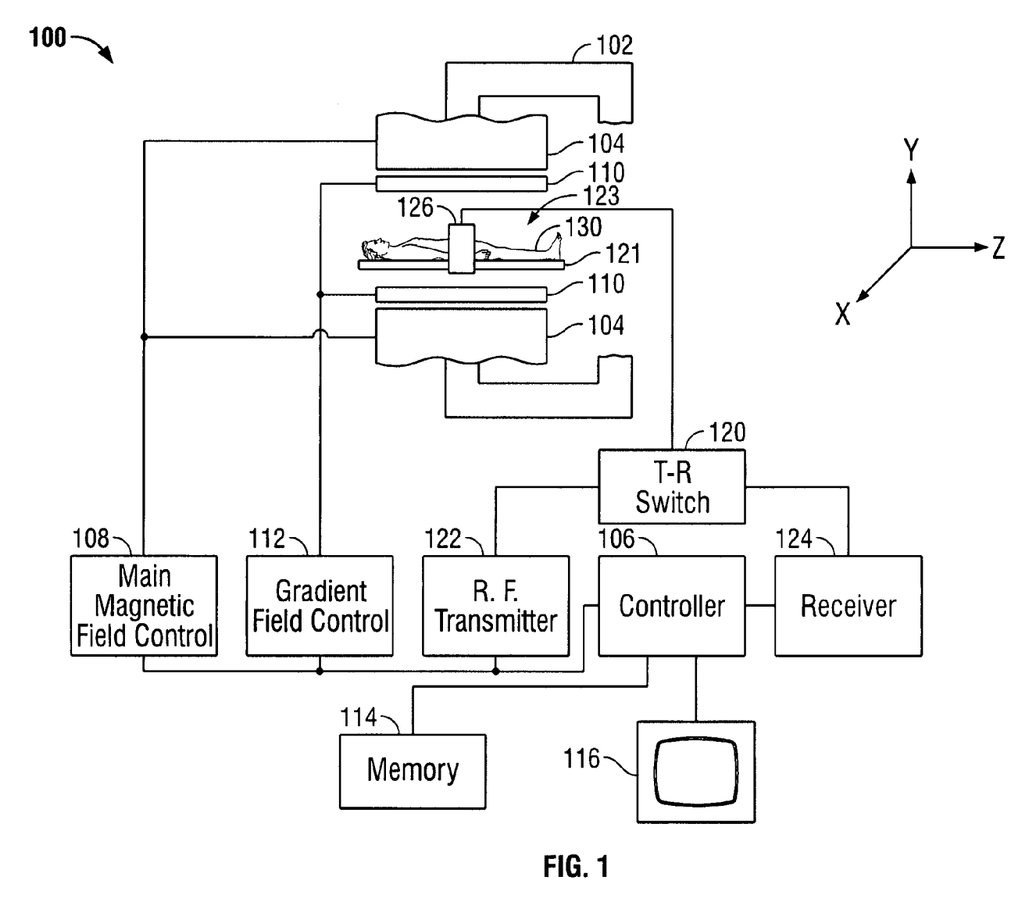
FIG. 1 is a block diagram of an exemplary embodiment of a magnetic resonance imaging (MRI) system in which systems and methods for parallel imaging are implemented.

FIG. 1 is a block diagram of an exemplary embodiment of an MRI system in which systems and methods for decoupling in accordance with various embodiments of the present invention may be implemented. As shown therein, an MRI system 100 includes an electromagnet 102, pole pieces 104, a controller 106, a main magnetic field control 108, a gradient coil sub-system 110, a gradient field control 112, a memory 114, a display device 116, a transmit-receive (T-R) switch 120, a radio frequency (RF) transmitter 122, a receiver 124 and an array of detectors 126 (e.g., a cylindrical array of equally-spaced detectors). It should be noted that although electromagnet 102 is a C-shaped magnet, other shapes of electromagnets can be used.

In use of the MRI system 100, a body 130 of an object, such as a patient or a phantom to be imaged, is placed in an opening or gap 123 between pole pieces 104 on a suitable support 121 (e.g., patient table). The electromagnet 102 produces a uniform and static main magnetic field $B_0$ across the gap 123. The strength of the electromagnetic field in the gap 123 and correspondingly in the body 130, is controlled by the controller 106 via a main magnetic field control 108, which also controls a supply of energizing current to the electromagnet 102.

The gradient coil sub-system 110, having one or more gradient coils, is provided so that a magnetic gradient can be imposed on the magnetic field $B_0$ in the gap 123 between pole pieces 44–144 in any one or more of three orthogonal directions x, y, and z. Gradient coil sub-system 110 is energized by gradient field control 112 and is also controlled by the controller 106.

The array 126, which may include a plurality of coils (e.g., resonant surface coils), is arranged to simultaneously detect MR signals from the body 130. The array 126 is selectably interconnected to one of the RF transmitter 122 or receiver 124 by the T-R switch 120. The RF transmitter 122 and T-R switch 120 are controlled by the controller 106 such that RF field pulses or signals are generated by the RF transmitter 122 and selectively applied to the body 130 for excitation of magnetic resonance in the body 130. While the RF excitation pulses are being applied to the body 130, the T-R switch 120 also is actuated to decouple the receiver 124 from the array 126.

Following application of the RF pulses, the T-R switch 120 is again actuated to decouple the array 126 from the RF transmitter 122 and to couple the array 126 to the receiver 124. The array 126 includes detectors that operate to detect or sense the MR signals resulting from the excited nuclei in the body 130 and communicates the MR signals to the receiver 124. These detected MR signals are in turn communicated to the controller 106. The controller 106 includes a processor (e.g., image reconstruction processor) that controls the processing of the MR signals to produce signals representative of an image of the body 130. The processed signals representative of the image are transmitted to the display device 116 to provide a visual display of the image. Specifically, the MR signals fill or form a k-space which is Fourier transformed to obtain a viewable image. The processed signals representative of the image are then transmitted to the display device 116.

In operation, the magnetic field $B_0$ generated by the electromagnet 102 is applied to the body 130 that lies along a z-axis of a Cartesian coordinate system, the origin of which is within the body 130. The uniform magnetic field $B_0$ being applied has the effect of aligning nuclear spins, a quantum mechanical property of nuclei within the body 130, along the y-axis. In response to the RF pulses of a proper resonant frequency being generated by the RF transmitter 122, and that are orientated within an x-z plane perpendicular to the y-axis, the nuclei resonate at their Larmor frequencies. In a typical imaging sequence, an RF pulse centered about the Larmor frequency is applied to the body 130 at the same time a magnetic field gradient $G_z$ is being applied along the z-axis by means of the gradient coil sub-system 110. The gradient $G_z$ causes nuclei in a slice with a limited width through the body 130 along the x-y plane, to have a resonant frequency and to be excited into resonance.

After excitation of the nuclei in the slice, magnetic field gradients $G_x$ and $G_y$ are applied along the x and y axes respectively. The magnetic field gradient $G_x$ along the x-axis causes the nuclei to precess at different frequencies depending on their position along the x-axis. Essentially, $G_x$ spatially encodes the precessing nuclei by frequency, referred to as frequency encoding. A y-axis gradient $G_y$ is incremented through a series of values and encodes a y-axis rate of change of phase of the precessing nuclei as a function of the amplitude of the gradient $G_y$, a process referred to as phase encoding.

Figure 2:
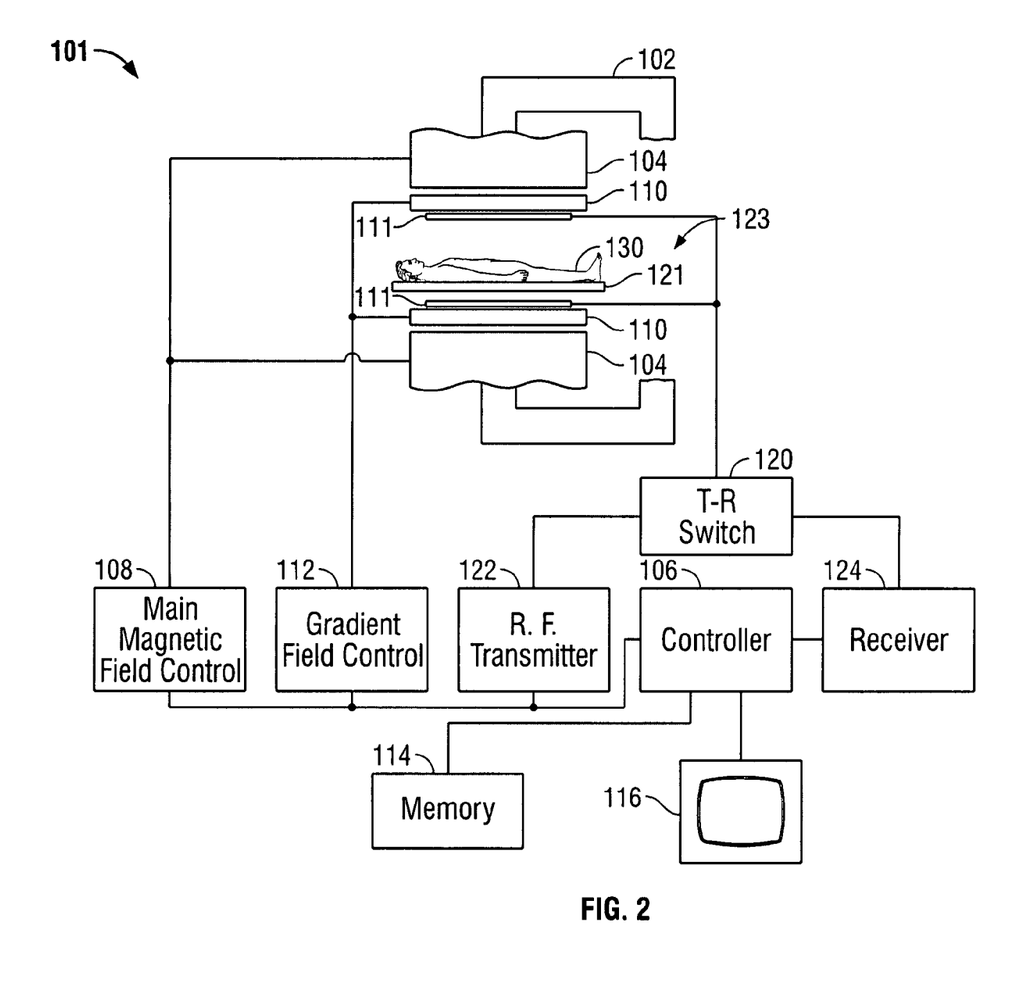
FIG. 2 is a block diagram of another exemplary embodiment of a magnetic resonance imaging (MRI) system in which systems and methods for parallel imaging are implemented.

It should be noted that the various embodiments of the present invention are not limited to use in connection with the MRI system 100 described herein, but may be implemented in connection with other MRI systems and/or other medical imaging systems. For example, in an MRI system 101 as shown in FIG. 2, array 126 may be replaced with coil arrays 111. Further, and for example, instead of the electromagnet 102, a super-conducting magnet configured having a cylindrical bore shape may be used as part of an open MRI system having a vertical $B_0$ field.

Various exemplary embodiments of the present invention provide a system and method having coil arrangements for use in parallel imaging, such, as for example, in a PPA application. In general, the various exemplary embodiments provide an array of coil elements (e.g., resonant surface coils) that includes one or more twisted portions that may be used to form, for example, a saddle train coil, and which also may include, for example, a plurality of saddle, butterfly or figure-eight coil elements. The saddle train coil may be used, for example, in connection with MRI system 100 or 101 performing parallel imaging to generate phase and magnitude information regarding the $B_1$ field from the coils for encoding of the signals during image reconstruction, which also reduces image acquisition time. The total number of coil elements may be determined based on the maximum number of receiver channels, the volume of interest to be covered, and the possibility of combining the saddle train coils with other coil elements (e.g., loop and figure-eight coils) in an array.

Figure 3:
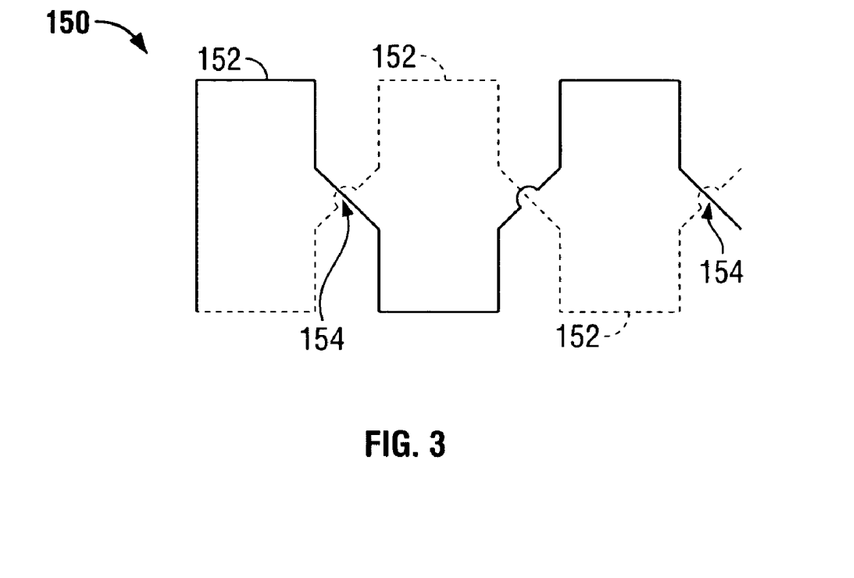
FIG. 3 is a schematic diagram of a coil arrangement of an exemplary embodiment of the present invention.

In particular, a coil array using a plurality of twisted portions according to various embodiments of the present invention generally includes multiple coil elements. These coil elements may include, for example, loop, saddle/butterfly/figure-eight, and saddle train coil elements. Specifically, as shown in FIG. 3, an exemplary embodiment of a portion of a coil arrangement having a saddle train coil 150 is shown therein and includes one or more sections 152. The saddle train coil 150 is configured such that a cross-over or twisted portion 154 is used to create the one or more sections 152 forming the saddle train coil 150. Although the sections 152 are illustrated as generally rectangular, the shape and size of the sections 152 may be modified as desired or needed (e.g., based upon the parallel imaging or clinical coverage requirements). Thus, the saddle train coil 150 is not limited to a saddle coil configuration. Further, although the cross-over or twisted portion 154 is illustrated as forming a generally "X" shape, the configuration of this portion may be modified, for example, to have a more curved crossing arrangement (e.g., two "S" shapes). Thus, the coil arrangement in one exemplary embodiment includes a saddle train coil 150 generally forming an extendable coil arrangement (e.g., extendable saddle coil arrangement) having a plurality of twisted portions 154 that form the sections 152.

Figure 4:
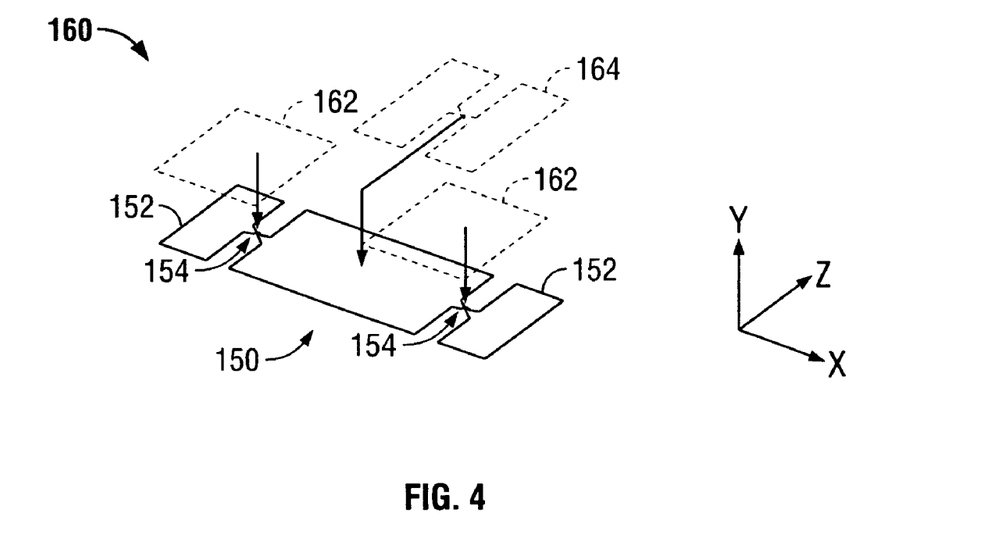
FIG. 4 is a schematic diagram of a coil array including a saddle train of an exemplary embodiment of the present invention.

As shown in FIG. 4, one exemplary embodiment of a coil array 160 configured as a saddle train coil array is constructed using the saddle train coil 150 and generally includes two loop coils 162, one saddle coil 164 and a saddle train coil 150 having a plurality of twisted portions 154 forming sections 152. It should be noted that the number, arrangement, shape and size of the elements of the various coil elements in the coil array 160 is merely exemplary and may be modified as desired or needed. For example, the positioning of any of the coil elements along a horizontal axis (e.g., positioning of coil elements from forward to back) or along a vertical axis (e.g., the positioning of elements from top to bottom) may be modified, for example, based upon the type of MRI system or clinical coverage requirements. Thus, in various embodiments the saddle train coil 150 and/or other coil array portions may be positioned above or below the loop coils 162 (e.g., forming an array having separate portions, sections, layers or levels). Further, and for example, the size of the various coil elements may be configured based upon the type of imaging to be performed, such as configured for torso/abdominal or cardiac imaging. The coil elements also may be configured, for example, based upon the different areas of a patient to be imaged (e.g., different sectors). Additionally, the various embodiments having, for example, the saddle train coil 150 may be used in connection with coil elements other than loop coils, for example, additional saddle coils and/or figure-eight coils.

Figure 5:
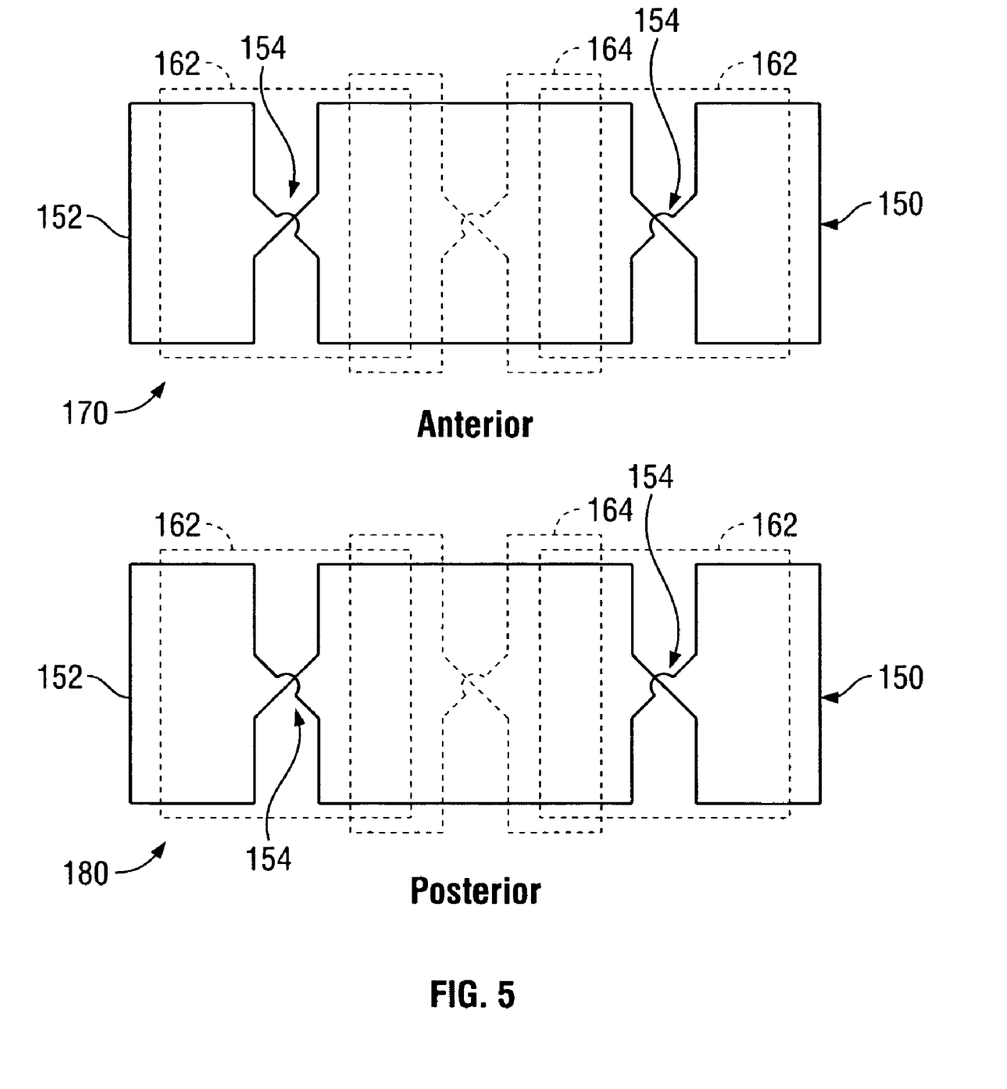
FIG. 5 is a schematic diagram of an anterior coil array and a posterior coil array including a saddle train of an exemplary embodiment of the present invention.

Thus, as shown in FIG. 5, an exemplary embodiment of the present invention may include an anterior coil array 170 and a posterior coil array 180. The anterior coil array 170 and posterior coil array 180 are each formed of two loop coils 162, one saddle coil 164 positioned generally in about the middle or center of the coil arrangement and a saddle train coil 150 having a plurality of twisted portions 154 forming sections 152. In operation, the size of the elements of the anterior coil array 170 and posterior coil array 180 may be determined to optimize, for example, the g-factor, clinical coverage (e.g., FOV) and SNR. The anterior coil array 170 and posterior coil array 180 further may be configured, for example, contoured to fit a human torso (e.g., anterior coil array 170 slightly curved to conform to a patient's torso). Further, and as described herein, the size and shape of sections 152 may be modified. For example, the saddle train coil 150 may be configured to wrap around a patient's head to provide head imaging.

It should be noted that although the saddle coil 164 is positioned generally in about the middle or center of the coil arrangement, it is not so limited, and the saddle coil 164 may be positioned in different locations relative to the other elements in the anterior coil array 170 and/or posterior coil array 180. It also should be noted that the saddle coil 164 and/or loop coils 162 may or may not overlap with the adjacent loop coils 162.

Figure 6:
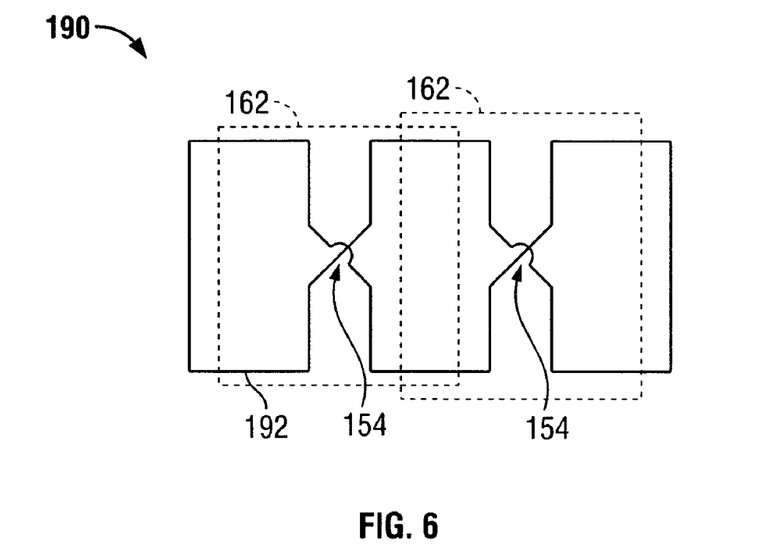
FIG. 6 is a schematic diagram of a three-lobe saddle train coil of an exemplary embodiment of the present invention.
Figure 7:
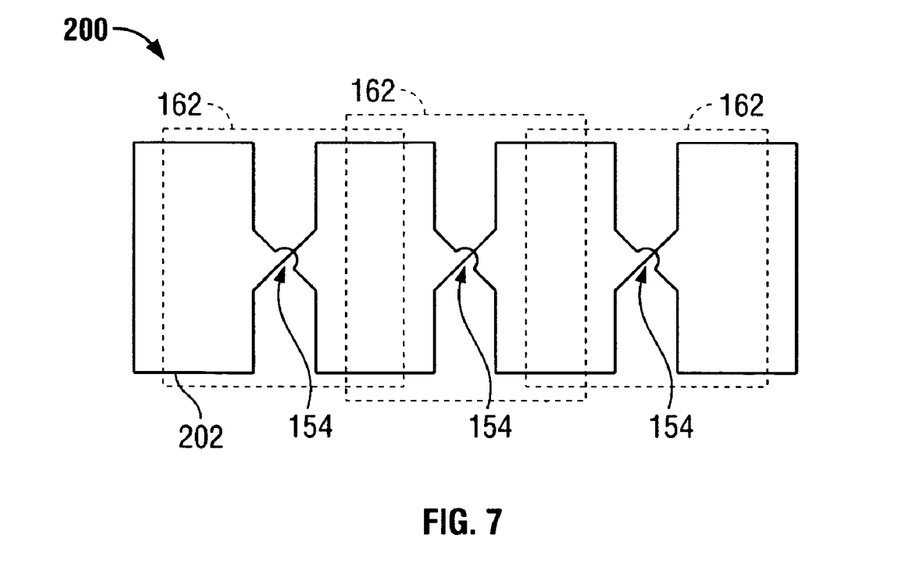
FIG. 7 is a schematic diagram of a four-lobe saddle train coil of an exemplary embodiment of the present invention.

Further, the number of twisted portions 154 may be modified, for example, increased as desired or needed. Thus, as shown in FIG. 6, a three-section or three-lobe coil arrangement 190 may be provided and configured as a three-section or three-lobe saddle train coil. As shown therein, the three-section or three-lobe coil arrangement 190 includes two loop coils 162 and a three-section or three-lobe saddle train coil 192 having two twisted portions 154. The three-section or three-lobe coil arrangement 190 further may, for example, be configured to be curved to fit the contour of a human body as described herein. Additionally, although the loop coils 162 are shown as overlapping, they may be configured to not overlap (e.g., gap between the loop coils 162), for example, for a net gain in SNR due to the improved geometry factor when using SENSE imaging. Further, as shown in FIG. 7, a four-section or four-lobe coil arrangement 200 may be provided and configured as a four-section or four-lobe saddle train coil. As shown therein, the four-section or four-lobe coil arrangement includes three loop coils 162 and a four-section or four-lobe saddle train coil 202 having three twisted portions 154. Again, the four-section or four-lobe coil arrangement 200 may, for example, be configured to be curved to fit the contour of a human body. Also, although the loop coils 162 are shown as overlapping, they may be configured to not overlap (e.g., gap between the loop coils 162), for example, for a net gain in SNR due to the improved geometry factor when using SENSE imaging.

It should be noted that the size of the sections 152, twisted portions 154 and saddle train coil (e.g., the number of sections or lobes) may be modified (e.g., increased or decreased) as desired or needed. For example, the number of twisted portions 154 may be increased or decreased to form a coil arrangement having more or less sections 152.

The various embodiments of coil arrangements may be used in connection with different MRI systems, and are not limited to use in connection with the MRI system 100 or 101. For example, the anterior coil array 170 and posterior coil array 180 shown in FIG. 5 form an eight-channel array, having four loop coils 162, two saddle coils 164 and two saddle train coils 150 (i.e., eight coil elements), and may be used in connection with an MRI system having eight channels (e.g., eight transmit/receive channels). However, the anterior coil array 170 and posterior coil array 180 may be used in connection with a four-channel MRI system by combining the coil elements (e.g., in-phase, anti-phase or quadrature combining) as desired or needed, and is known. Further, the coil elements may be isolated by various geometric decoupling methods (e.g., capacitive decoupling, decoupling by overlapping coils and decoupling using transformers) as are known, and further enhanced by using low impedance preamplifiers for each of the coil elements.

Thus, the various exemplary embodiments of the present invention provide coil arrangements for medical imaging having higher SNR for use in connection with parallel imaging (e.g., PPA imaging). The various exemplary embodiments also provide for improved determination of phase and magnitude information for use in parallel image reconstruction using a plurality of twisted portions. Additionally, the various exemplary embodiments allow for different combinations and positioning of coil elements for use in parallel imaging, which coil elements also may be combined.

While the invention has been described in terms of various specific embodiments, those skilled in the art will recognize that the invention can be practiced with modification within the spirit and scope of the claims.

What is claimed is:

1. A coil arrangement for a medical imaging system, the coil arrangement comprising:
    a plurality of adjacent coil elements for a medical imaging system wherein at least one of the plurality of coil elements is between other ones of the plurality of coil elements and each of the plurality of coil elements is about the same size; and
    a plurality of cross-over portions interconnecting each of the plurality of coil elements, and wherein a cross-over portion is provided generally centered between each of the plurality of coil elements.

2. A coil arrangement in accordance with claim 1 wherein the plurality of coil elements comprise at least one saddle coil element.

3. A coil arrangement in accordance with claim 1 wherein the plurality of coil elements comprise at least one each of a saddle coil element and a loop coil element.

4. A coil arrangement in accordance with claim 1 wherein the plurality of coil elements comprise at least one saddle coil element and at least one loop coil element and together with the plurality of twisted portions forms a saddle train coil array.

5. A coil arrangement in accordance with claim 1 wherein the plurality of coil elements are configured to be combined.

6. A coil arrangement in accordance with claim 1 wherein the plurality of coil elements comprise a plurality of overlapping loop coil elements.

7. A coil arrangement in accordance with claim 1 wherein the plurality of coil elements comprise a plurality of non-overlapping loop coil elements.

8. A coil arrangement in accordance with claim 1 wherein the medical imaging system comprises a magnetic resonance imaging (MRI) system and the coil elements comprise resonant surface coils.

9. A coil arrangement in accordance with claim 1 wherein the plurality of cross-over portions are each configured in a cross-over arrangement.

10. A coil arrangement in accordance with claim 9 wherein the cross-over arrangement is configured to provide phase encoding information.

11. A coil arrangement in accordance with claim 1 wherein the plurality of coil elements comprise at least one each of a saddle coil element and a loop coil element, and wherein the saddle coil element is positioned generally in about the middle of the coil arrangement.

12. A coil array for a medical imaging system, the coil array comprising:
 a first coil array portion having a plurality of coil elements for a medical imaging system; and
 a second coil array portion having a multi-lobe saddle train with at least one lobe between two other lobes, the multi-lobe saddle train comprising a plurality of cross-over portions and wherein a cross-over portion is provided between each adjacent lobe of the multi-lobe saddle train, each of the cross-over portions located a distance from each of an edge of adjacent lobes.

13. A coil array in accordance with claim 12 wherein the first coil array portion comprises a plurality of loop coil elements.

14. A coil array in accordance with claim 12 wherein the multi-lobe saddle train further comprises at least one saddle coil.

15. A coil array in accordance with claim 12 wherein the first and second coil array portions are configured to be combined.

16. A coil array in accordance with claim 12 wherein the first and second coil array portions together form a coil array configured to be used in combination with other coil arrays.

17. A coil array in accordance with claim 12 wherein the first coil array portion is positioned adjacent the second coil array portion.

18. A coil array in accordance with claim 12 wherein the medical imaging system comprises a magnetic resonance imaging (MRI) system and the coil array portions comprise resonant surface coils.

19. A coil array in accordance with claim 12 wherein the first coil array portion comprises at least one loop coil element and the plurality of cross-over portions are configured having a cross-over arrangement, with the at least one loop coil element generally centered in relation to the cross-over arrangement.

20. A method for providing coil arrays for a medical imaging system, the method comprising:
 configuring a coil array to include a plurality of cross-over portions in combination with a plurality of coil elements; and
 providing a cross-over portion generally centered between each of three contiguous coil elements of the plurality of coil elements with the three contiguous coil elements being about the same size.

21. A method in accordance with claim 20 further comprising forming a saddle train with the plurality of twisted portions.

* * * * *